(12) United States Patent
Nakamura

(10) Patent No.: US 10,734,417 B2
(45) Date of Patent: Aug. 4, 2020

(54) DISPLAY DEVICE

(71) Applicant: Japan Display Inc., Minato-ku (JP)

(72) Inventor: Masato Nakamura, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/504,895

(22) Filed: Jul. 8, 2019

(65) Prior Publication Data
US 2019/0333941 A1 Oct. 31, 2019

Related U.S. Application Data

(63) Continuation of application No. 15/786,950, filed on Oct. 18, 2017, now Pat. No. 10,396,102.

(30) Foreign Application Priority Data

Nov. 30, 2016 (JP) .................................. 2016-233427

(51) Int. Cl.
| | |
|---|---|
| *H01L 27/12* | (2006.01) |
| *H01L 29/786* | (2006.01) |
| *H01L 27/02* | (2006.01) |
| *G02F 1/1368* | (2006.01) |
| *G02F 1/1362* | (2006.01) |

(Continued)

(52) U.S. Cl.
CPC ........ *H01L 27/1244* (2013.01); *G02F 1/1368* (2013.01); *G02F 1/136204* (2013.01); *G02F 1/136286* (2013.01); *H01L 27/0288* (2013.01); *H01L 27/124* (2013.01); *H01L 27/1222* (2013.01); *H01L 29/78675* (2013.01); *G02F 1/133512* (2013.01); *G02F 1/133514* (2013.01); *G02F 1/134309* (2013.01); *G02F 1/136227* (2013.01); *G02F 2001/13685* (2013.01); *G02F 2001/133388* (2013.01); *G02F 2201/121* (2013.01); *G02F 2201/122* (2013.01); *G02F 2201/123* (2013.01); *G02F 2202/104* (2013.01); *G02F 2202/22* (2013.01);

(Continued)

(58) Field of Classification Search
CPC ............. H01L 27/1244; H01L 27/1222; G02F 1/136204; G02F 1/136286; G02F 1/1368
See application file for complete search history.

(56) References Cited

U.S. PATENT DOCUMENTS

| | | | |
|---|---|---|---|
| 9,678,397 B2 * | 6/2017 | Miyamoto | ............ G02F 1/1368 |
| 2009/0102758 A1 | 4/2009 | Anzai et al. | |

(Continued)

FOREIGN PATENT DOCUMENTS

| | | |
|---|---|---|
| JP | 2016-57344 | 4/2016 |
| WO | 2007/105700 | 9/2007 |

*Primary Examiner* — Mark W Tornow
(74) *Attorney, Agent, or Firm* — Oblon, McClelland, Maier & Neustadt, L.L.P.

(57) ABSTRACT

According to one embodiment, a display device includes first semiconductor layers crossing a first scanning line in a non-display area, the first semiconductor layers being a in number, second semiconductor layers crossing a second scanning line in the non-display area, the second semiconductor layers being b in number, and an insulating film disposed between the first and second semiconductor layers and the first and second scanning lines, wherein a and b are integers greater than or equal to 2, and a is different from b, and the first and second semiconductor layers are both entirely covered with the insulating film.

13 Claims, 14 Drawing Sheets

(51) Int. Cl.
    *G02F 1/1335* (2006.01)
    *G02F 1/1343* (2006.01)
    *G02F 1/1333* (2006.01)

(52) U.S. Cl.
    CPC .. *H01L 29/78633* (2013.01); *H01L 29/78645* (2013.01); *H01L 29/78696* (2013.01)

(56) References Cited

U.S. PATENT DOCUMENTS

| | | |
|---|---|---|
| 2009/0102824 A1 | 4/2009 | Tanaka et al. |
| 2011/0025971 A1* | 2/2011 | Fujikawa .......... G02F 1/136227 349/149 |
| 2013/0148049 A1* | 6/2013 | Abe ................ G02F 1/136286 349/43 |
| 2016/0035284 A1 | 2/2016 | Jung et al. |
| 2016/0071884 A1 | 3/2016 | Miyamoto et al. |
| 2016/0116776 A1* | 4/2016 | Hayashi ................ G02F 1/1368 349/43 |

* cited by examiner

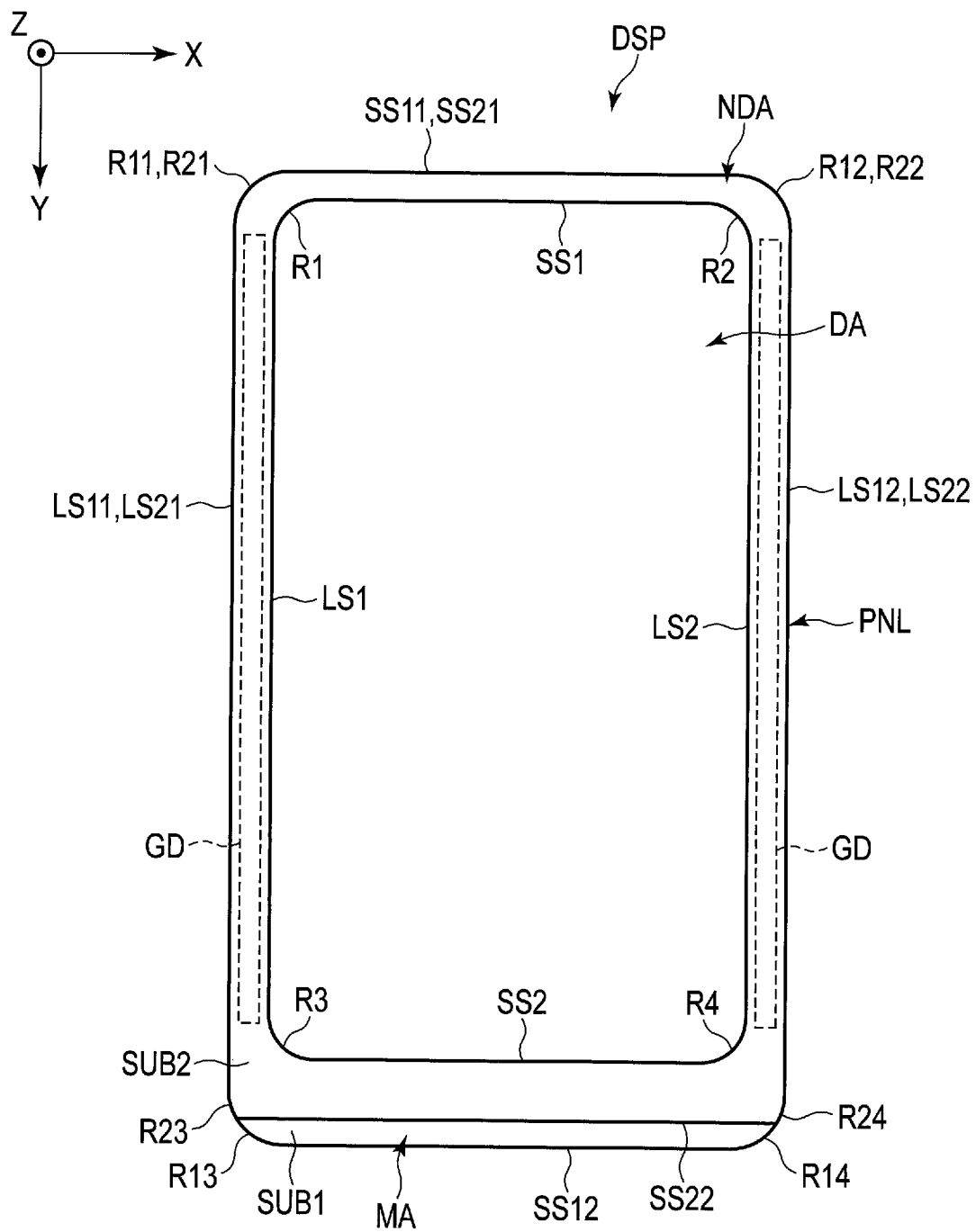
F I G. 1

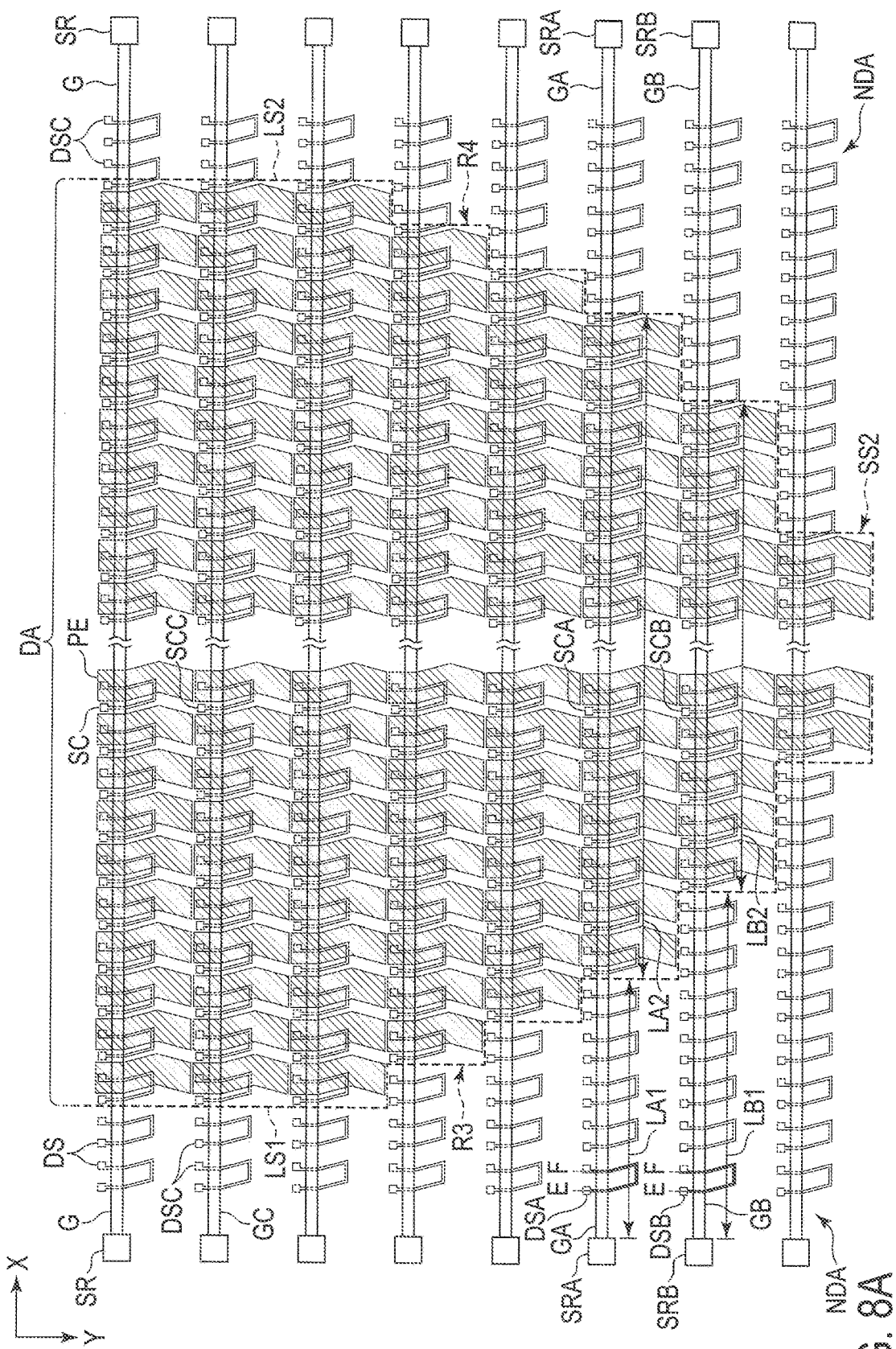
F I G. 8A

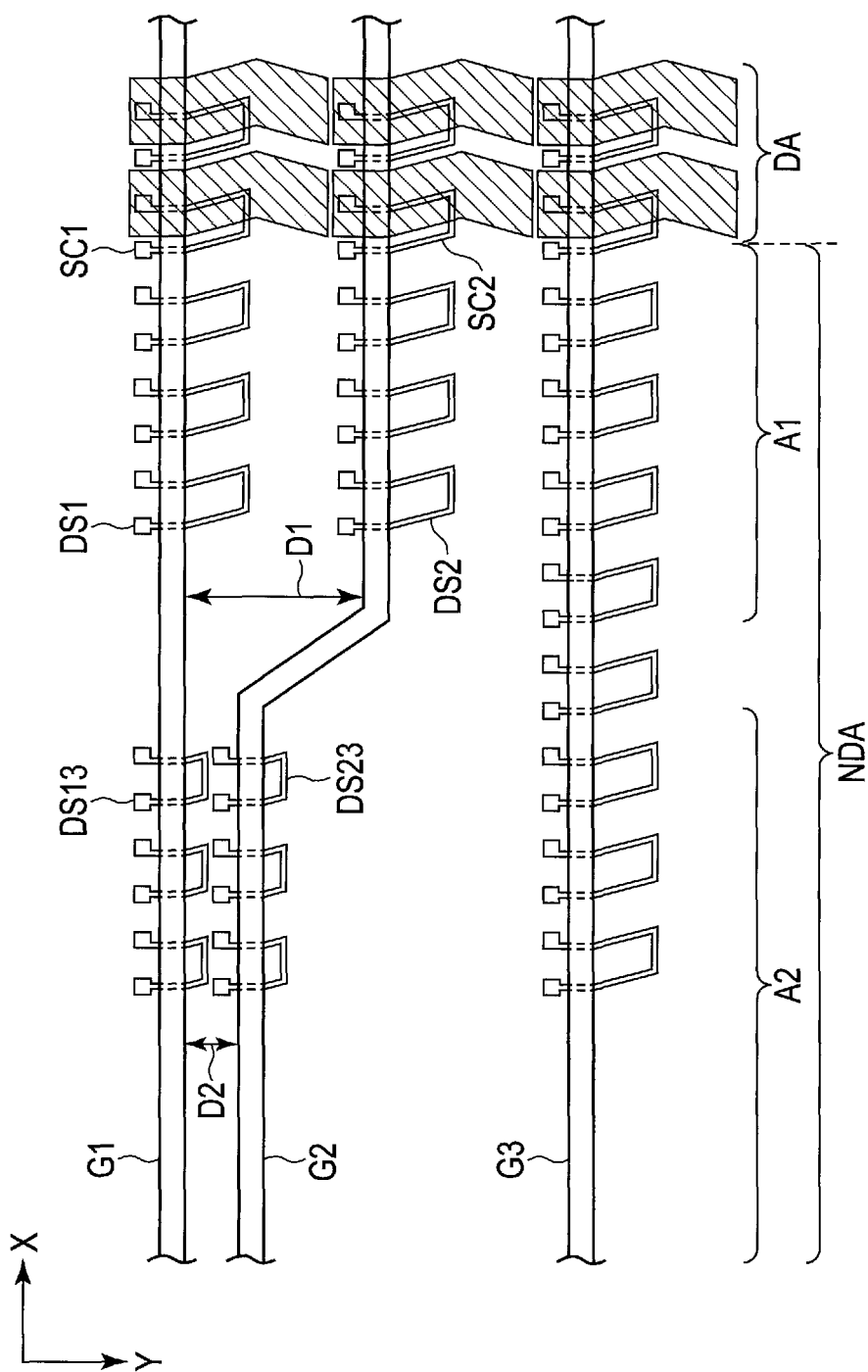
F I G. 12

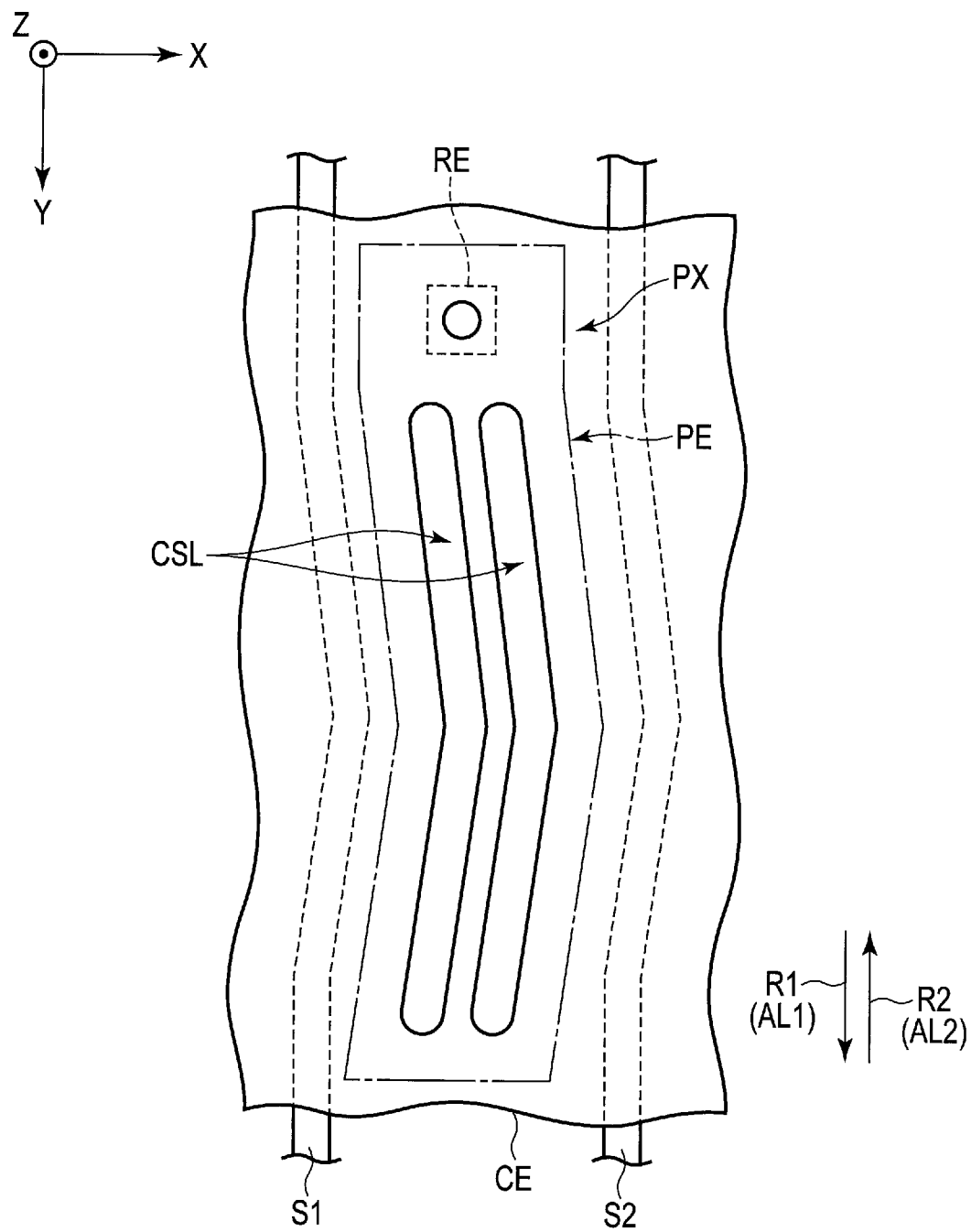
F I G. 14

DISPLAY DEVICE

CROSS-REFERENCE TO RELATED APPLICATIONS

This application is a continuation of U.S. application Ser. No. 15/786,950, filed Oct. 18, 2017, which is based upon and claims the benefit of priority from Japanese Patent Application No. 2016-233427, filed Nov. 30, 2016, the entire contents of each of which are incorporated herein by reference.

FIELD

Embodiments described herein relate generally to a display device.

BACKGROUND

A breakdown caused by electrostatic discharge (ESD) in the display device leads to reduction in a manufacturing yield. Accordingly, various countermeasures against static electricity have been proposed. In one example, a technology of arranging a dummy pixel outside a display area, and providing a dummy semiconductor layer crossing a scanning line in the dummy pixel has been proposed.

Meanwhile, recently, a display device having a display area with a round portion has been proposed. With such a round portion, a wiring length of the scanning line from the display area to a scanning line drive circuit is increased, and a resistance to the ESD may be lowered.

BRIEF DESCRIPTION OF THE DRAWINGS

FIG. 1 is a plan view showing an appearance of a display device DSP of the present embodiment.

FIG. 8A is a plan view of an area including the round portion R3 shown in FIG. 7 and a round portion R4 on the opposite side in enlarged scale.

FIG. 12 is a plan view showing yet another layout of the semiconductor layers DS.

FIG. 14 is a plan view showing another configuration example of the pixel electrode PE arranged in the pixel PX.

DETAILED DESCRIPTION

Figure 2:
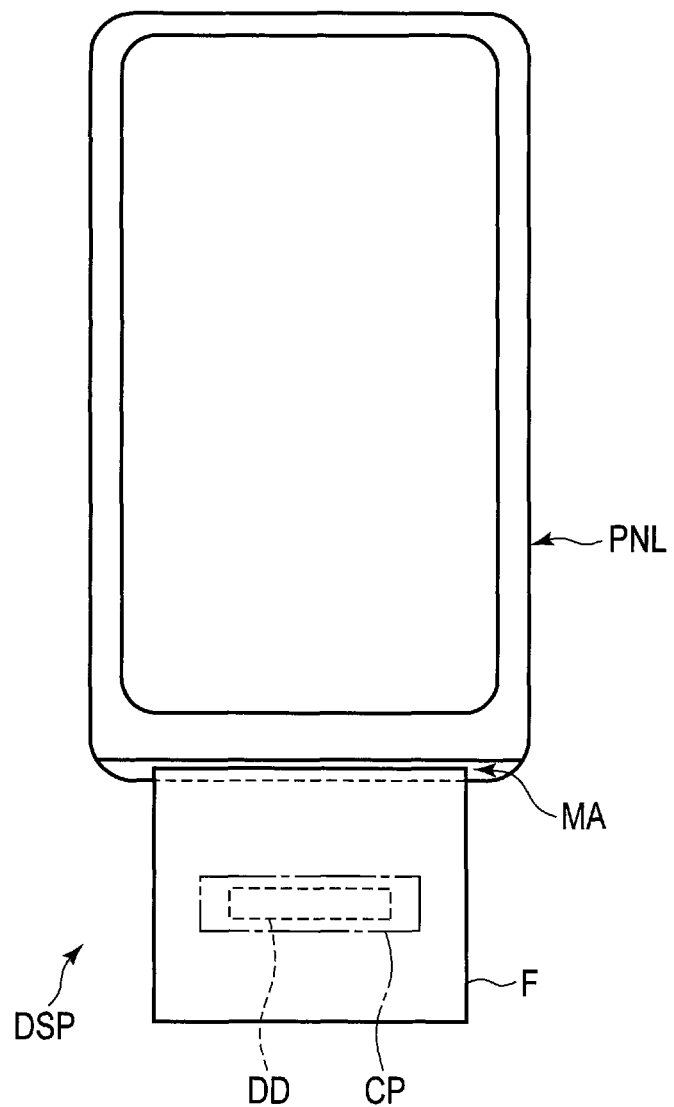
FIG. 2 is a plan view showing a configuration example of a display panel PNL shown in FIG. 1 on which a signal source is mounted.

In general, according to one embodiment, a display device includes: a first scanning line and a second scanning line which extend over a display area and a non-display area; first semiconductor layers crossing the first scanning line in the non-display area, the first semiconductor layers being a in number; second semiconductor layers crossing the second scanning line in the non-display area, the second semiconductor layers being b in number; and an insulating film disposed between the first and second semiconductor layers and the first and second scanning lines, wherein the first scanning line has a first wiring length in the non-display area, the second scanning line has a second wiring length different from the first scanning length in the non-display area, a and b are integers greater than or equal to 2, and a is different from b, and the first and second semiconductor layers are both entirely covered with the insulating film.

According to another embodiment, a display device includes: a first scanning line and a second scanning line which extend over a display area and a non-display area; first semiconductor layers crossing the first scanning line in the non-display area, the first semiconductor layers being a in number; second semiconductor layers crossing the second scanning line in the non-display area, the second semiconductor layers being b in number; and an insulating film between the first and second semiconductor layers and the first and second scanning lines, wherein the display area includes a first round portion, a second round portion, and a linear portion between the first and second round portions, the first scanning line and the second scanning line cross the first round portion and the second round portion, the second scanning line is located between the first scanning line and the linear portion, a and b are integers greater than or equal to 2, and b is greater than a, and the first and second semiconductor layers are both entirely covered with the insulating film.

According to yet another embodiment, a display device includes: a first scanning line and a second scanning line which extend over a display area and a non-display area; first semiconductor layers crossing the first scanning line in the non-display area, the first semiconductor layers being a in number; second semiconductor layers crossing the second scanning line in the non-display area, the second semiconductor layers being b in number; and an insulating film covering the first and second semiconductor layers, wherein the first scanning line and the second scanning line are formed on the insulating film, a is different from b, and the first and second semiconductor layers are both entirely covered with the insulating film.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, and redundant detailed description thereof is omitted unless necessary.

FIG. 1 is a plan view showing an appearance of a display device DSP of the present embodiment. The figure shows a plan view of the display device DSP in an X-Y plane defined by a first direction X and a second direction Y which intersect each other. A third direction Z in this figure is the direction which intersects the first direction X and the second direction Y. In one example, while the first direction X, the second direction Y, and the third direction Z are orthogonal to each other, they may cross each other at an angle other than 90 degrees. In the present specification, a direction toward a pointing end of an arrow indicating the third direction Z is referred to as upward (or merely above), and a direction toward the opposite side from the pointing end of the arrow is referred to as downward (or merely below). Further, it is assumed that an observation position at which the display device DSP is to be observed is at the pointing end side of the arrow indicating the third direction Z, and a view toward the X-Y plane from the observation position is called a planar view.

In the present embodiment, a liquid crystal display device is explained as an example of the display device. Note that the main structures disclosed in the present embodiment are applicable to display devices such as a self-luminous display device with organic electroluminescent display elements and the like, an electronic paper display device with electrophoretic elements and the like, a display device employing micro-electromechanical systems (MEMS), and a display device employing electrochromism.

The display device DSP includes a display panel PNL, etc. The display panel PNL is, for example, a liquid crystal display panel, and includes a first substrate SUB1, a second substrate SUB2, and a liquid crystal layer (a liquid crystal layer LC which will be described later). The second substrate SUB2 is opposed to the first substrate SUB1. The display panel PNL includes a display area DA in which an image is displayed, and a frame-shaped non-display area NDA surrounding the display area DA. The non-display area NDA includes a mounting area MA in which a signal source including elements such as an IC chip and a flexible printed circuit board is mounted.

When the appearance of the display panel PNL is focused, the first substrate SUB1 includes a pair of short sides SS11 and SS12 extending along the first direction X, a pair of long sides LS11 and LS12 extending along the second direction Y, and four round portions R11 to R14. The second substrate SUB2 includes a short side SS21 overlapping the short side SS11, long sides LS21 and LS22 overlapping the long sides LS11 and LS12, respectively, round portions R21 and R22 overlapping the round portions R11 and R12, respectively, round portions R23 and R24, and a short side SS22. The short side SS22 does not overlap the short side SS12. More specifically, the round portion R23 connects the short side SS22 and the long side LS21, the round portion R24 connects the short side SS22 and the long side LS22, the round portion R23 is curved so as to partially overlap the round portion R13, and the round portion R24 is curved so as to partially overlap the round portion R14. The mounting area MA is located between the short side SS12 and the short side SS22 in the first substrate SUB1.

The display area DA includes a pair of short sides SS1 and SS2 extending along the first direction X, a pair of long sides LS1 and LS2 extending along the second direction Y, and four round portions R1 to R4. The short sides SS1 and SS2, and the long sides LS1 and LS2 correspond to linear portions connecting between round portions that are adjacent to each other. More specifically, radii of curvature which define the round portion R representing a boundary between the display area DA and the non-display area NDA, and the round portion R of the first substrate SUB1 and the second substrate SUB2 may agree with each other at the corresponding parts, or may be different from each other.

Further, a width of the mounting area MA, in other words, a distance between the short side SS12 and the short side SS22 along the second direction Y, is substantially the same as or less than a width of the long side of the non-display area NDA, in other words, a distance between the long side LS1 and the long side LS11 along the first direction X (or a distance between the long side LS2 and the long side LS12). Furthermore, a width of the short side of the non-display area NDA, i.e., a distance between the short side SS1 and the short side SS11 along the second direction Y, is equal to the width of the long side of the non-display area NDA.

The display panel PNL of the present embodiment may be a transmissive display panel having a transmissive display function of displaying an image by selectively transmitting light from a rear surface of the first substrate SUB1, a reflective display panel having a reflective display function of displaying an image by selectively reflecting light from a front surface of the second substrate SUB2, or a transflective display panel having the transmissive display function and the reflective display function.

FIG. 2 is a plan view showing a configuration example of the display panel PNL shown in FIG. 1 on which the signal source is mounted.

In the example illustrated, the display device DSP includes a flexible printed circuit board F mounted on the mounting area MA of the display panel PNL, and an IC chip CP mounted on the flexible printed circuit board F. In the IC chip CP, a display driver DD which outputs a signal necessary for image display, for example, is incorporated. In the drawing, the IC chip CP is indicated by a one-dot chain line, and the display drive DD is indicated by a dotted line. The drawing shows the so-called COF (chip-on-film) structure. The display driver DD in this context includes at least a part of a signal line drive circuit SD, a scanning line drive circuit GD, and a common electrode drive circuit CD, which will be described later. Note that the structure of the display device DSP is not limited to the example illustrated. That is, the IC chip CP may have the so-called COG (chip-on-glass) structure in which the IC chip CP is mounted on the mounting area MA.

Figure 3:
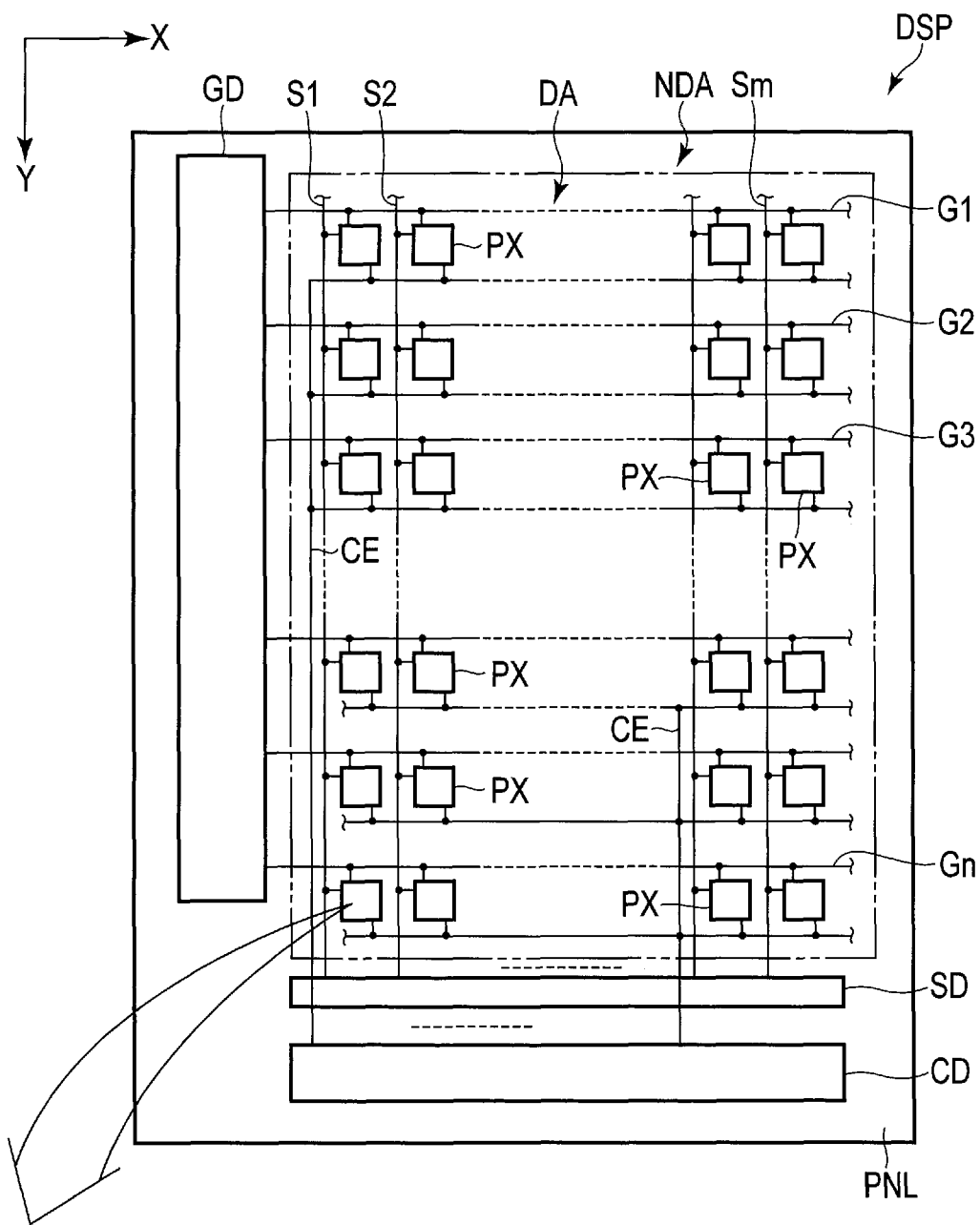
FIG. 3 is an illustration showing a basic structure and an equivalent circuit of the display panel PNL shown in FIG. 1.
Figure 3:
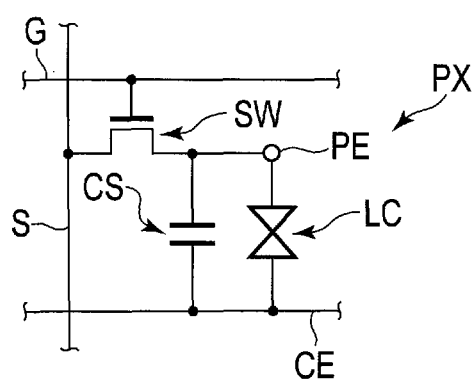

FIG. 3 is an illustration showing a basic structure and an equivalent circuit of the display panel PNL shown in FIG. 1, and the round portions R as shown in FIG. 1 are not illustrated. The display panel PNL includes a plurality of pixels PX in the display area DA. The pixels PX are arrayed in a matrix. Also, the display panel PNL includes scanning lines G (G1 to Gn), signal lines S (S1 to Sm), a common electrode CE, etc., in the display area DA. The scanning lines G extend in the first direction X, and are arranged to be spaced apart from each other in the second direction Y. The signal lines S extend in the second direction Y, and are arranged to be spaced apart from each other in the first direction X. Note that the scanning lines G and the signal lines S do not necessarily extend linearly, and may be partially bent. Even if the scanning lines G and the signal lines S are ones which are partially bent, they extend in the first direction X and the second direction Y. The common electrode CE is disposed over the pixels PX.

The scanning lines G are connected to the scanning line drive circuit GD. The signal lines S are connected to the signal line drive circuit SD. The common electrode CE is connected to the common electrode drive circuit CD. The signal line drive circuit SD, the scanning line drive circuit GD, and the common electrode drive circuit CD may be formed on the first substrate SUB1 in the non-display area NDA, or some of these circuits or all of these circuits may be incorporated in the IC chip CP shown in FIG. 2. In one example, the scanning line drive circuits GD are provided between the long side LS1 and the long side LS11 and between the long side LS2 and the long side LS12, respectively, as shown by dotted lines in FIG. 1. However, the layout of the respective drive circuits is not limited to the example illustrated.

Each of the pixels PX comprises a switching element SW, a pixel electrode PE, the common electrode CE, the liquid crystal layer LC, and the like. The switching element SW is constituted by a thin-film transistor (TFT), for example, and is electrically connected to the scanning line G and the signal line S. The scanning line G is connected to the switching elements SW of the respective pixels PX arranged in the first direction X. The signal line S is connected to the switching elements SW of the respective pixels PX arranged in the second direction Y. The pixel electrode PE is electrically connected to the switching element SW. Each pixel electrode PE is opposed to the common electrode CE, and drives the liquid crystal layer LC by an electric field produced between the pixel electrode PE and the common electrode CE. A storage capacitance CS is formed between, for example, an electrode having the same potential as that of the common electrode CE and an electrode having the same potential as that of the pixel electrode PE.

Although the details of the configuration of the display panel PNL will not be described here, in a display mode using a longitudinal electric field formed along the normal of the substrate main surface or a display mode using an oblique electric field which is tilted obliquely with respect to the normal of the substrate main surface, the pixel electrode PE is disposed in the first substrate SUB1 while the common electrode CE is disposed in the second substrate SUB2. Further, in a display mode using a lateral electric field formed along the substrate main surface, both the pixel electrode PE and the common electrode CE are disposed in the first substrate SUB1. Moreover, the display panel PNL may have a structure corresponding to a display mode using an arbitrary combination of the longitudinal, lateral, and oblique electric fields. Note that the substrate main surface corresponds to the X-Y plane defined by the first direction X and the second direction Y.

Figure 4:
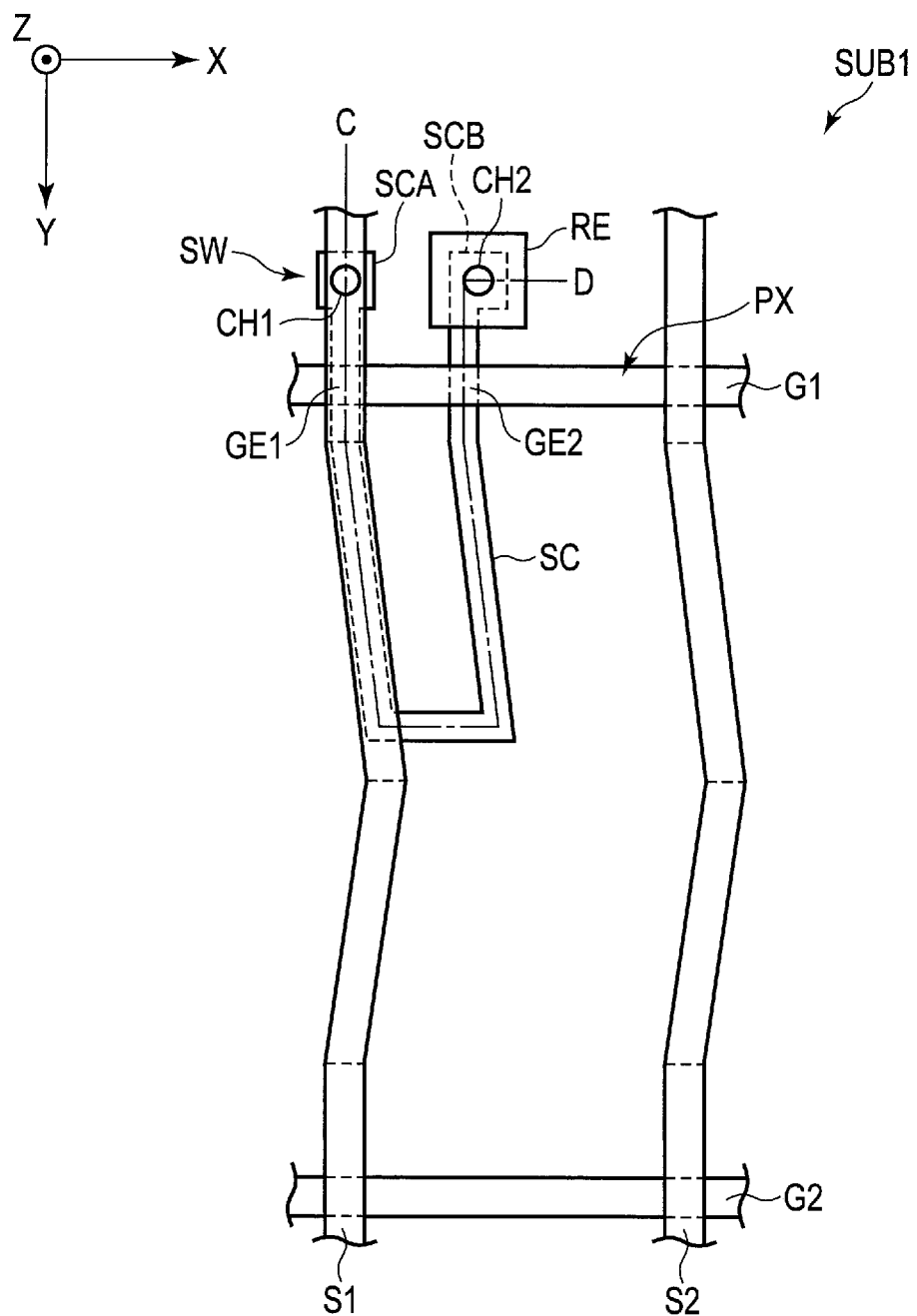
FIG. 4 is a plan view showing a configuration example of a pixel PX when the first substrate SUB1 shown in FIG. 1 is viewed from the second substrate SUB2.

FIG. 4 is a plan view showing a configuration example of the pixel PX when the first substrate SUB1 shown in FIG. 1 is viewed from the second substrate SUB2. Note that in this figure, only the structures necessary for explanation have been illustrated, and illustration of the pixel electrode and common electrode has been omitted.

The first substrate SUB1 comprises the scanning lines G1 and G2, the signal lines S1 and S2, the switching element SW, etc.

The scanning lines G1 and G2 are disposed at an interval in the second direction Y, and each of the scanning lines G1 and G2 extends in the first direction X. The signal lines S1 and S2 are disposed at an interval in the first direction X, and each of the signal lines S1 and S2 extends in the second direction Y. In the example illustrated, while the signal lines S1 and S2 are partially bent, they may be extended linearly along the second direction Y. The pixel PX corresponds to a box-shaped area which is defined by the scanning lines G1 and G2 and the signal lines S1 and S2. Note that the shape of the pixel PX is not limited to that of the illustrated example. That is, the pixel PX may be shaped in a rectangle extending in the second direction Y, and can be changed as appropriate.

The switching element SW is electrically connected to the scanning line G1 and the signal line S1. The switching element SW of the illustrated example has a double-gate structure. The switching element SW comprises a semiconductor layer SC and a relay electrode RE. The semiconductor layer SC is disposed such that a part of it overlaps the signal line S1, and the other part is extended between the signal lines S1 and S2 to form a substantially U-shaped configuration. The semiconductor layer SC crosses the scanning line G1 in an area overlapping the signal line S1 and a portion between the signal lines S1 and S2. In the scanning line G1, areas overlapping the semiconductor layer SC serve as gate electrodes GE1 and GE2, respectively. The semiconductor layer SC is electrically connected to the signal line S1 through a contact hole CH1 at an end portion SCA of the semiconductor layer SC, and is electrically connected to the relay electrode RE through a contact hole CH2 at the other end portion SCB of the semiconductor layer SC. The relay electrode RE is formed in an island shape, and is disposed between the signal lines S1 and S2.

Figure 5:
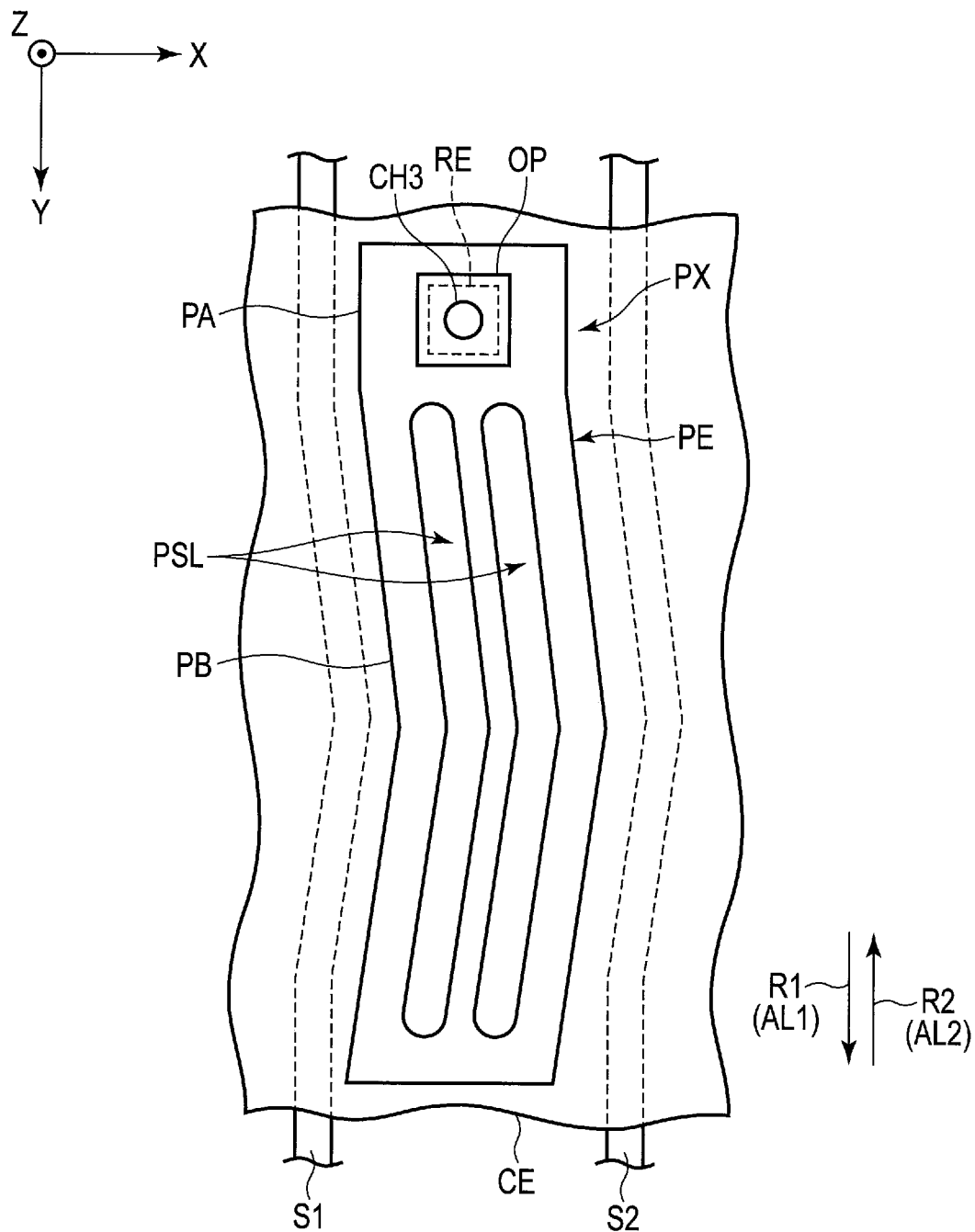
FIG. 5 is a plan view showing a configuration example of a pixel electrode PE arranged in the pixel PX.

FIG. 5 is a plan view showing a configuration example of the pixel electrode PE arranged in the pixel PX. Note that in this figure, only the structures necessary for explanation have been illustrated, and illustration of the scanning lines and switching element has been omitted.

The pixel electrode PE is disposed between the signal lines S1 and S2. The pixel electrode PE comprises a contact portion PA and a main electrode portion PB. The contact portion PA and the main electrode portion PB are formed integrally or continuously, and are electrically connected to each other. The contact portion PA is disposed at a position overlapping the relay electrode RE, and is electrically connected to the relay electrode RE through a contact hole CH3. The main electrode portion PB has a shape extending along the signal lines S1 and S2, and in the example illustrated, the main electrode portion PB has two slits PSL which are bent in a way similar to the signal line S1. The two slits PSL are arranged at an interval in the first direction X, and have a substantially uniform width along the first direction X. Note that the shape of the pixel electrode PE is not limited to that of the example illustrated, and can be changed as appropriate according to the shape, etc., of the pixel PX. Also, the shape, the number, or the like, of the slits PSL are not limited to those of the example illustrated.

The common electrode CE overlaps the signal lines S1 and S2, and the scanning line G1 not illustrated. The pixel electrode PE is overlaid on the common electrode CE. The common electrode CE includes an opening OP at a position overlapping the relay electrode RE.

Figure 6:
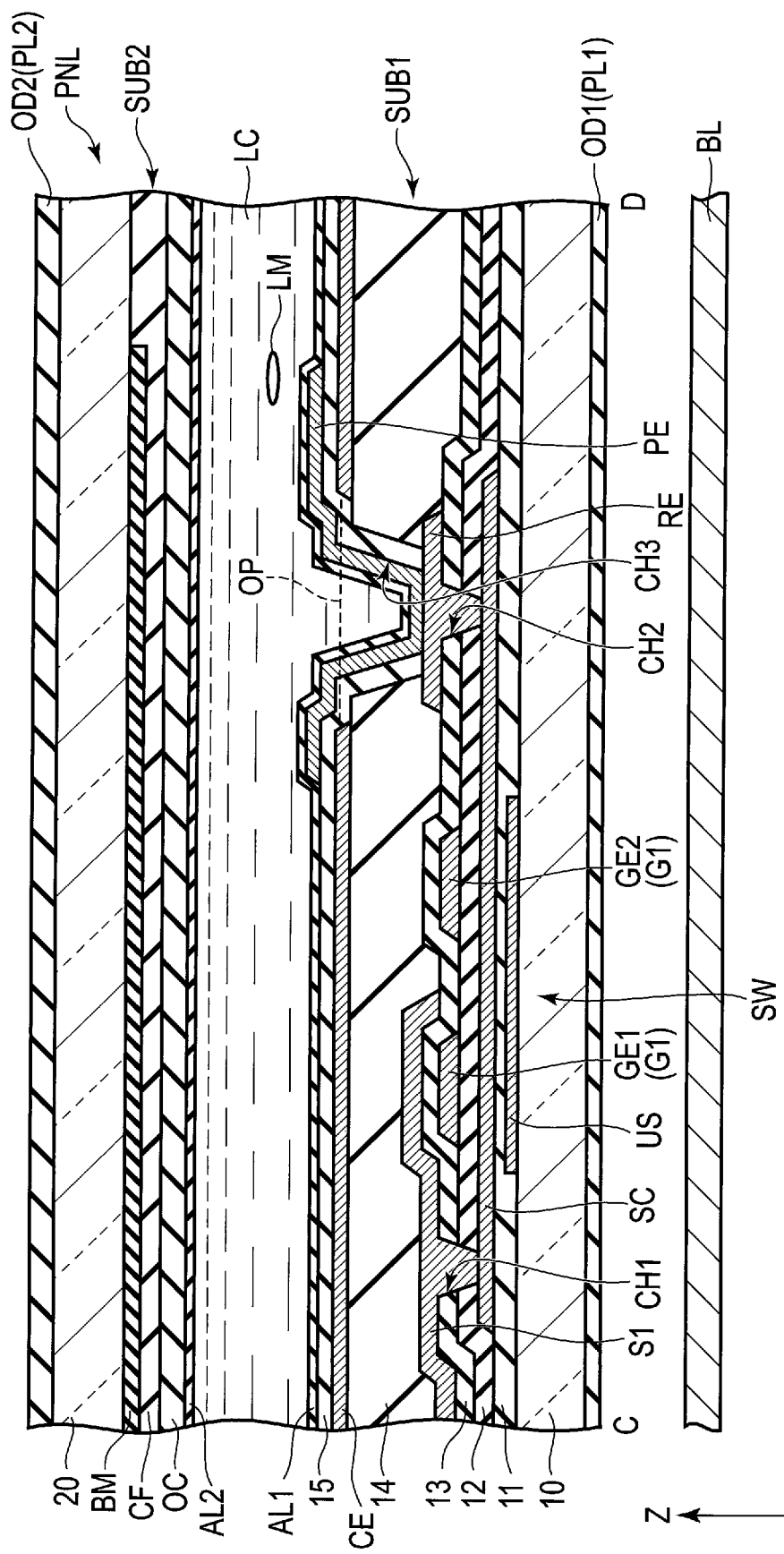
FIG. 6 is a cross-sectional view showing a configuration example of the display panel PNL taken along line C-D of FIG. 4.

FIG. 6 is a cross-sectional view showing a configuration example of the display panel PNL taken along line C-D of FIG. 4. The illustrated example corresponds to a case where a fringe field switching (FFS) mode, which is one of display modes using a lateral electric field, is applied.

The first substrate SUB1 includes a first insulating substrate 10, a first insulating film 11, a second insulating film 12, a third insulating film 13, a fourth insulating film 14, a fifth insulating film 15, a lower light-shielding layer US, the semiconductor layer SC, the scanning line G1, the signal line S1, the relay electrode RE, the common electrode CE, the pixel electrode PE, a first alignment film AL1, and the like.

The first insulating substrate 10 is a light transmissive substrate such as a glass substrate or a resin substrate. The lower light-shielding layer US is located on the first insulating substrate 10 and is covered with the first insulating film 11. The lower light-shielding layer US blocks light directed toward the semiconductor layer SC from a backlight unit BL. The semiconductor layer SC is located on the first insulating film 11 and is covered with the second insulating film 12. The semiconductor layer SC is formed of, for example, polycrystalline silicon, but may be formed of amorphous silicon or an oxide semiconductor.

The gate electrodes GE1 and GE2, which are parts of the scanning line G1, are disposed on the second insulating film 12, and are covered with the third insulating film 13. Note that the scanning line G2, which is not illustrated, is also disposed in the same layer as the scanning line G1. The scanning line G1 is formed of a metal material such as aluminum (Al), titanium (Ti), silver (Ag), molybdenum (Mo), tungsten (W), copper (Cu) or chromium (Cr), or an alloy obtained by combining the aforementioned metal materials. The scanning line G1 may have a single-layer structure or a multilayer structure. The lower light-shielding layer US should preferably be located directly under the semiconductor layer SC at a position opposed to the gate electrodes GE1 and GE2.

The signal line S1 and the relay electrode RE are located on the third insulating film 13, and are covered with the fourth insulating film 14. Note that the signal line S2, which is not illustrated, is also disposed in the same layer as the signal line S1. The signal line S1 and the relay electrode RE are formed of the same material, and the above-mentioned metal material, for example, can be applied. The signal line S1 is in contact with the semiconductor layer SC through the contact hole CH1 which penetrates the second insulating film 12 and the third insulating film 13. The relay electrode RE is in contact with the semiconductor layer SC through the contact hole CH2 which penetrates the second insulating film 12 and the third insulating film 13.

The common electrode CE is located on the fourth insulating film 14 and is covered with the fifth insulating film 15. The pixel electrode PE is located on the fifth insulating film 15 and is covered with the first alignment film AL1. A part of the pixel electrode PE is opposed to the common electrode CE via the fifth insulating film 15. Each of the common electrode CE and the pixel electrodes PE is a transparent electrode formed of a transparent conductive material such as indium-tin-oxide (ITO) or indium-zinc-oxide (IZO). The pixel electrode PE is in contact with the relay electrode RE through the contact hole CH3 which penetrates the fourth insulating film 14 and the fifth insulating film 15 at a position overlapping the opening OP of the common electrode CE.

Each of the first insulating film 11, the second insulating film 12, the third insulating film 13, and the fifth insulating film 15 is an inorganic insulating film such as silicon oxide, silicon nitride, or silicon oxynitride, and may have a single-layer structure or a multilayer structure. The fourth insulating film 14 is an organic insulating film such as acrylic resin.

The second substrate SUB2 comprises a second insulating substrate 20, a light-shielding layer BM, a color filter CF, an overcoat layer OC, a second alignment film AL2, etc.

The second insulating substrate 20 is a light transmissive substrate such as a glass substrate or a resin substrate. The light-shielding layer BM and the color filter CF are located in the second insulating substrate 20, on the side opposed to the first substrate SUB1. In one example, the light-shielding layer BM is arranged at a position opposed to wiring portions such as the signal lines S1 and S2, the scanning lines G1 and G2, and the switching element SW shown in FIG. 4. The color filter CF is arranged at a position opposed to the pixel electrode PE, and a part of the color filter CF overlaps the light-shielding layer BM. The color filer CF includes, for example, a red color filter colored red, a green color filter colored green, and a blue color filter colored blue, and may further include a color filter of the other color, or a transparent or white color filter. The overcoat layer OC covers the color filters CF. The overcoat layer OC is formed of a transparent resin. The second alignment film AL2 covers the overcoat layer OC. The first alignment film AL1 and the second alignment film AL2 are formed of, for example, a material exhibiting horizontal alignment properties. In one example, as shown in FIG. 5, an alignment treatment direction R1 of the first alignment film AL1 is parallel to the second direction Y, and an alignment treatment direction R2 of the second alignment film AL2 is parallel to the alignment treatment direction R1, but is opposite to the alignment treatment direction R1.

Note that the color filter CF may be arranged in the first substrate SUB1. The light-shielding layer BM may be arranged between the color filter CF and the overcoat layer OC, or between the overcoat layer OC and the second alignment film AL2. Further, instead of arranging the light-shielding layer BM, two or more color filters of different colors may be stacked on one another to reduce the transmittance, so that the stacked color filters function as the light-shielding layer. Also, a pixel which displays white may be added, and a white color filter or an uncolored resin material may be disposed on the white pixel, or the overcoat layer OC may be disposed without arranging the color filter. Moreover, in a monochrome display device, a color filter is omitted.

The first substrate SUB1 and the second substrate SUB2 described above are arranged such that the first alignment film AL1 and the second alignment film AL2 are opposed to each other. A spacer is formed of a resin material, and is arranged between the first substrate SUB1 and the second substrate SUB2 though this is not illustrated in the drawing. A predetermined cell gap is thereby formed between the first alignment film AL1 and the second alignment film AL2. However, the spacer may include, apart from a main spacer which forms the cell gap, a sub-spacer which does not contact one of the substrates in the steady state in which no external stress is applied to the display panel PNL. The cell gap is, for example, 2 to 5 µm. The first substrate SUB1 and the second substrate SUB2 are bonded to each other by a sealant with a predetermined cell gap formed between these two substrates.

The liquid crystal layer LC is located between the first substrate SUB1 and the second substrate SUB2, and is held between the first alignment film AL1 and the second alignment film AL2. The liquid crystal layer LC includes liquid crystal molecules LM. The liquid crystal layer LC described above is composed of, for example, a positive liquid crystal material (i.e., a liquid crystal material with positive dielectric anisotropy), or a negative liquid crystal material (i.e., a liquid crystal material with negative dielectric anisotropy).

A first optical element OD1 including a first polarizer PL1 is arranged below the first substrate SUB1. Further, a second optical element OD2 including a second polarizer PL2 is arranged above the second substrate SUB2. In one example, the first polarizer PL1 and the second polarizer PL2 are arranged such that their absorption axes are orthogonal to each other in the X-Y plane. Note that the first optical element OD1 and the second optical element OD2 may include a retardation film such as a quarter-wave plate or a half-wave plate, a scattering layer, an antireflective layer, etc., if necessary.

In such a configuration example, in an off-state in which no electric field is produced between the pixel electrode PE and the common electrode CE, the liquid crystal molecules LM are initially aligned in a predetermined direction (for example, the second direction Y) between the first alignment film AL1 and the second alignment film AL2. In this off-state, light irradiated from the backlight unit BL toward the display panel PNL is absorbed by the first optical element OD1 and the second optical element OD2 and the display becomes dark. Meanwhile, in an on-state in which an electric field is produced between the pixel electrode PE and the common electrode CE, the liquid crystal molecules LM are aligned in a direction different from the initial alignment direction by the electric field, and this alignment direction is controlled by the electric field. In such an on-state, part of the light from the backlight unit BL is transmitted through the first optical element OD1 and the second optical element OD2 and the display becomes bright.

Figure 7:
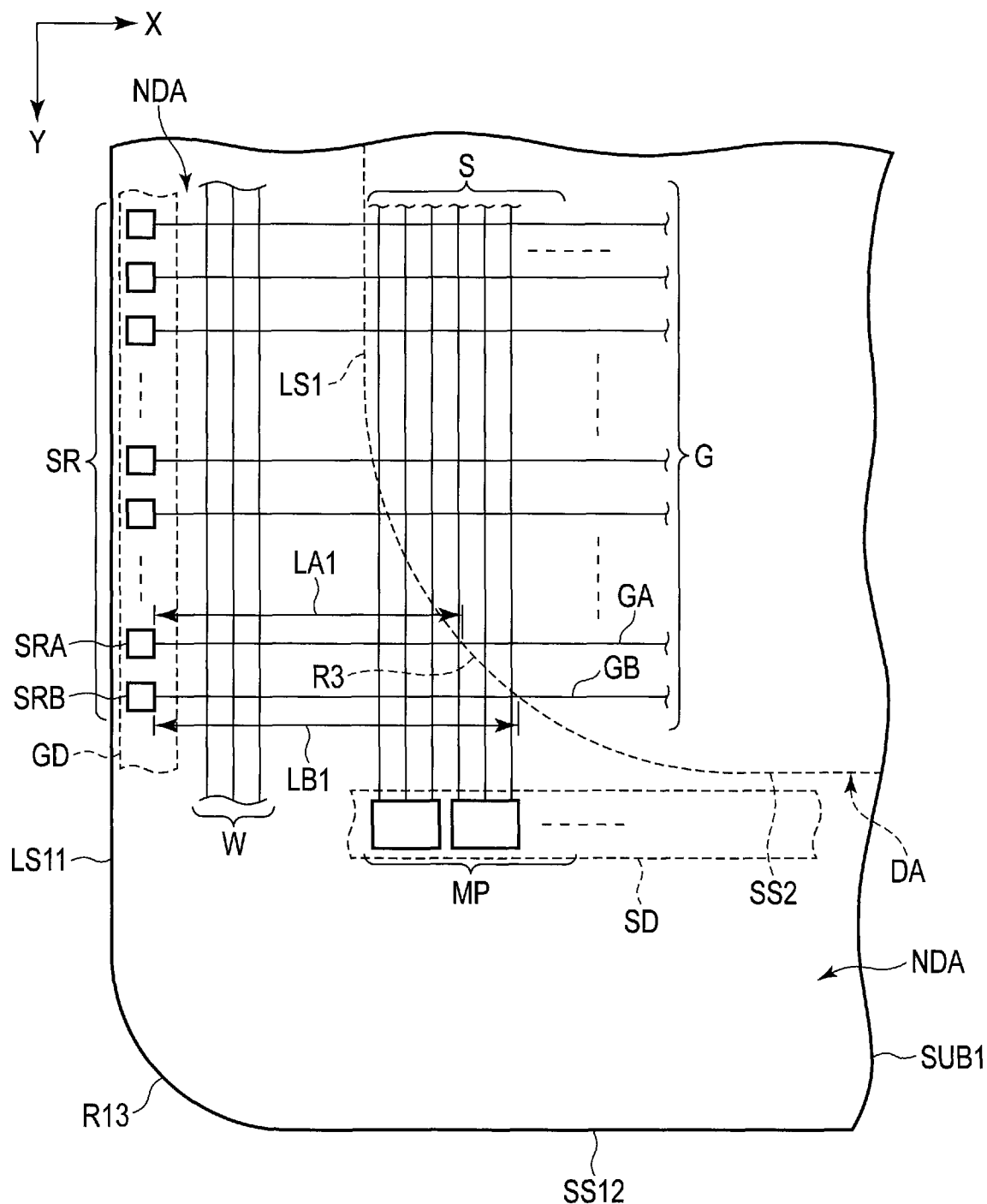
FIG. 7 is a plan view of the first substrate SUB1 in which an area including round portions R3 and R13 shown in FIG. 1 is enlarged.

FIG. 7 is a plan view of the first substrate SUB1 in which an area including the round portions R3 and R13 shown in FIG. 1 is enlarged.

The scanning line drive circuit GD comprises shift registers SR provided along the long side LS11. The scanning lines G extend over the display area DA and the non-display area NDA, and are connected to the shift registers SR, respectively, in the non-display area NDA. The signal line drive circuit SD includes select circuits (multiplexers) MP. Multiple signal lines S are connected to one select circuit MP in the non-display area. The select circuit MP illustrated is located between the round portion R3 and the short side SS12. Various wiring lines W crossing the scanning lines G in planar view are provided between the long side LS1 and the long side LS11. The wiring lines W include lines such as a power line.

Here, of the scanning lines G, scanning lines GA and GB crossing the round portion R3 are noted. The scanning line GB is closer to the short side SS2 than from the scanning line GA. The scanning line GA is connected to a shift register SRA, and the scanning line GB is connected to a shift register SRB. The scanning line GA has a wiring length (a first wiring length) LA1, and the scanning line GB has a wiring length (a second wiring length) LB1 in the non-display area NDA. The wiring length LB1 is different from the wiring length LA1, and in the example illustrated, the wiring length LB1 is greater than the wiring length LA1. The wiring length intended here is a length of a wiring line from a boundary between the display area DA and the non-display area NDA to the shift register. In the example illustrated, while each of the scanning lines is extended linearly in the first direction X in the non-display area NDA, the scanning lines may be bent. In either case, the full length of the scanning line in the non-display area NDA corresponds to the wiring length.

Note that while the wiring lengths of the scanning lines crossing the long side LS1 are substantially equal to each other, as regards the scanning lines crossing the round portion R3, the nearer the scanning line is to the short side SS2, the longer the wiring length of the scanning line tends to be.

FIG. 8A is a plan view of an area including the round portion R3 shown in FIG. 7 and the round portion R4 on the opposite side in enlarged scale. Note that in this figure, only the structures necessary for explanation have been illustrated, and illustration of the signal lines, the relay electrode, the common electrode, the wiring lines W, etc., has been omitted.

The pixel electrode PE is arranged in the display area DA, as has been described with reference to FIGS. 4 to 7, and the pixel electrode PE is electrically connected to the semiconductor layer SC. As illustrated in the drawing, while a semiconductor layer DS is arranged in the non-display area NDA as in the display area DA, a pixel electrode is not arranged in the non-display area NDA. In the example illustrated, the semiconductor layers DS are all shaped the same as the semiconductor layers SC in the display area DA, and each of the semiconductor layers DS crosses the scanning line G at two points. However, the semiconductor layers DS are all in an electrically floating state, and are not electrically connected to the pixel electrode. In one example, the semiconductor layer DS is formed of polycrystalline silicon likewise the semiconductor layer SC. As in the example illustrated in FIG. 6, the semiconductor layer DS is located between, for example, the first insulating film 11 and the second insulating film 12, and the second insulating film 12 is interposed between each of the scanning lines and the semiconductor layer DS. In other words, the semiconductor layer DS is entirely covered with the second insulating film 12, and a contact hole which is penetrated to the semiconductor layer DS is not formed in the second insulating film 12. The semiconductor layer DS as described above can be formed in the same process as that of forming the semiconductor layer SC.

Here, of the scanning lines G, the scanning lines GA and GB crossing the round portions R3 and R4 are noted. In one example, the round portion R3 corresponds to a first round portion, and the round portion R4 corresponds to a second round portion. Further, the scanning line GA corresponds to a first scanning line, and the scanning line GB corresponds to a second scanning line. As described above, in the non-display area NDA, the wiring length LB1 of the scanning line GB is greater than the wiring length LA1 of the scanning line GA.

The semiconductor layers DS located in the non-display area NDA include semiconductor layers DSA, the number of which is a, crossing the scanning line GA, and semiconductor layers DSB, the number of which is b, crossing the scanning line GB. In one example, the semiconductor layer DSA corresponds to a first semiconductor layer, and the semiconductor layer DSB corresponds to a second semiconductor layer. The number a of the semiconductor layers DSA is different from the number b of the semiconductor layers DSB. Note that a and b are, for example, integers greater than or equal to 2. In the example illustrated, b is greater than a, and in the non-display area NDA on a side close to the round portion R3 (i.e., the left side of the drawing), while a is 5, b is 7. The same holds true for the non-display area NDA on a side close to the round portion R4 (i.e., the right side of the drawing). Also, with respect to the other scanning lines, the longer the wiring length of the scanning line is, the greater the number of semiconductor layers DS crossing that scanning line is. However, the semiconductor layer DSA is not necessarily arranged. In this case, a becomes 0, and b is an integer greater than or equal to 1. In other words, if a case where the semiconductor layer DSA is not arranged is included, it suffices that a and b are different, a is an integer greater than or equal to 0, and b is an integer greater than or equal to 1.

In the non-display area NDA, as regards the scanning lines G crossing the long sides LS1 and LS2, while the numbers of semiconductor layers DS crossing the respective scanning lines G are the same, this number is less than the number of semiconductor layers DSA, for example. For example, the number e of the semiconductor layers DSC crossing a scanning line GC is two in the non-display area NDA on a side close to the long side LS1.

Figure 8B:
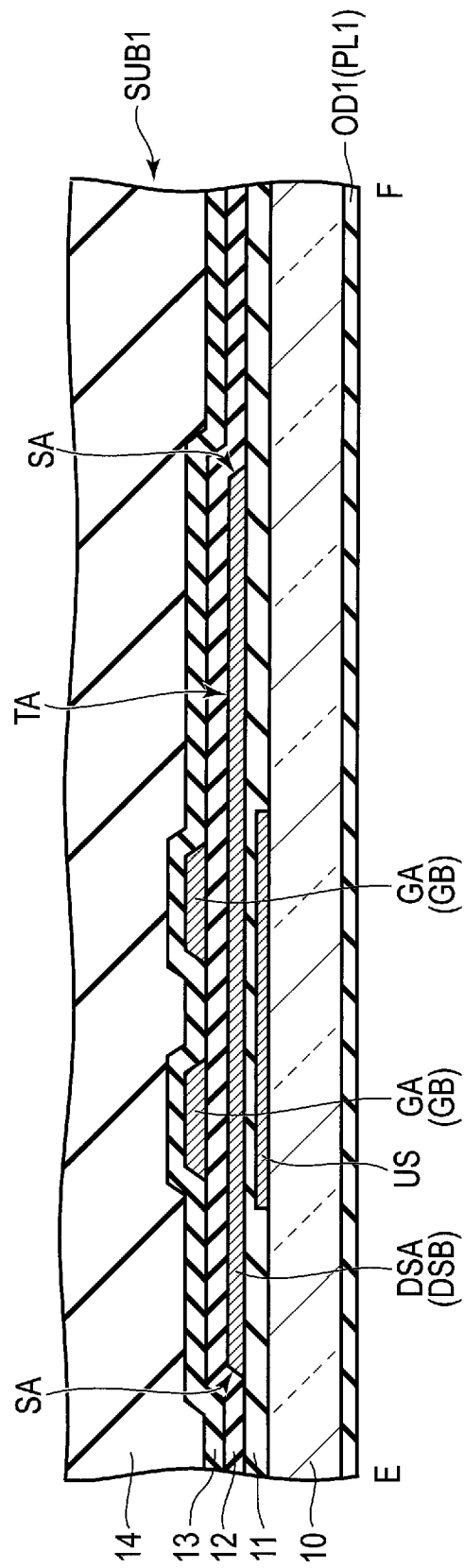
FIG. 8B is a cross-sectional view of semiconductor layers DSA and DSB taken along line E-F of FIG. 8A.

FIG. 8B is a cross-sectional view of the semiconductor layers DSA and DSB taken along line E-F of FIG. 8A. The semiconductor layer DSA is located between the first insulating film 11 and the second insulating film 12, and is entirely covered with the second insulating film 12. In other words, the second insulating film 12 is in contact with all of an upper surface TA and a side surface SA of the semiconductor layer DSA. The second insulating film 12 is located between the semiconductor layer DSA and the scanning line GA. Similarly, the semiconductor layer DSB is entirely covered with the second insulating film 12. The second insulating film 12 is located between the semiconductor layer DSB and the scanning line GB.

Next, referring to FIG. 8A again, the scanning lines GA and GB in the display area DA are noted. The scanning line GA has a wiring length (a third wiring length) LA2, and the scanning line GB has a wiring length (a fourth wiring length) LB2 in the display area DA. The wiring length LB2 is different from the wiring length LA2, and in the example illustrated, the wiring length LA2 is greater than the wiring length LB2.

The semiconductor layers SC located in the display area NDA include semiconductor layers SCA, the number of which is c, crossing the scanning line GA, and semiconductor layers SCB, the number of which is d, crossing the scanning line GB. In one example, the semiconductor layer SCA corresponds to a third semiconductor layer, and the semiconductor layer SCB corresponds to a fourth semiconductor layer. The number c of the semiconductor layers SCA is different from the number d of the semiconductor layers SCB. Note that c and d are integers greater than or equal to 2. In the example illustrated, c is greater than d, and in the display area DA on the left side of the drawing, while c is 7, d is 5. The same holds true for the display area DA on the right side of the drawing. Also, with respect to the other scanning lines, the longer the wiring length of the scanning line is in the display area DA, the greater the number of semiconductor layers SC crossing that scanning line is.

In the display area DA, as regards the scanning lines G crossing the long sides LS1 and LS2, while the numbers of semiconductor layers SC crossing the respective scanning lines G are the same, this number is greater than the number of semiconductor layers SCA, for example. For example, the number f of semiconductor layers SCC crossing the scanning line GC, is ten, in the display area DA on the left side of the drawing (i.e., the side close to the long side LS1).

According to the present embodiment, in the non-display area NDA, the semiconductor layers DS crossing the scanning lines G are provided. The semiconductor layer DS serves as a dummy pattern for suppressing a breakdown of the switching element SW, the signal line S, the scanning line, or the like, in the display area DA caused by electrostatic discharge (ESD). That is, the semiconductor layer DS is to suppress entry of static electricity, which is caused by charge accumulated in the manufacturing process of the first substrate SUB1, into the display area DA. More specifically, even if a voltage V is applied to the scanning line G due to accumulation of the charge drawn into the scanning line G from the outside, the charge is distributed between the semiconductor layer DS and the scanning line G in the non-display area NDA in a balanced manner. Accordingly, it is possible to prevent a dielectric breakdown between the semiconductor layer SC and the scanning line G in the display area DA, or a breakdown of the switching element SW electrically connected to the scanning line G by the ESD.

Also, in the present embodiment, the wiring lengths of the scanning lines G extended to the non-display area NDA so as to cross the round portion are different from each other. Even in such a case, according to the dimension of the wiring length, the number of semiconductor layers DS crossing the respective scanning lines G is different. Consequently, for all of the scanning lines G, the charge brought in from the outside can be distributed in a balanced manner, and a breakdown by the ESD can be prevented.

Accordingly, the ESD resistance can be improved in the display area DA including the round portion, and a reduction in a manufacturing yield can be suppressed.

Next, another configuration example will be described. Note that the same reference numbers will be added to the same structures as those of the configuration example described above, and detailed descriptions of them will be omitted.

Figure 9:
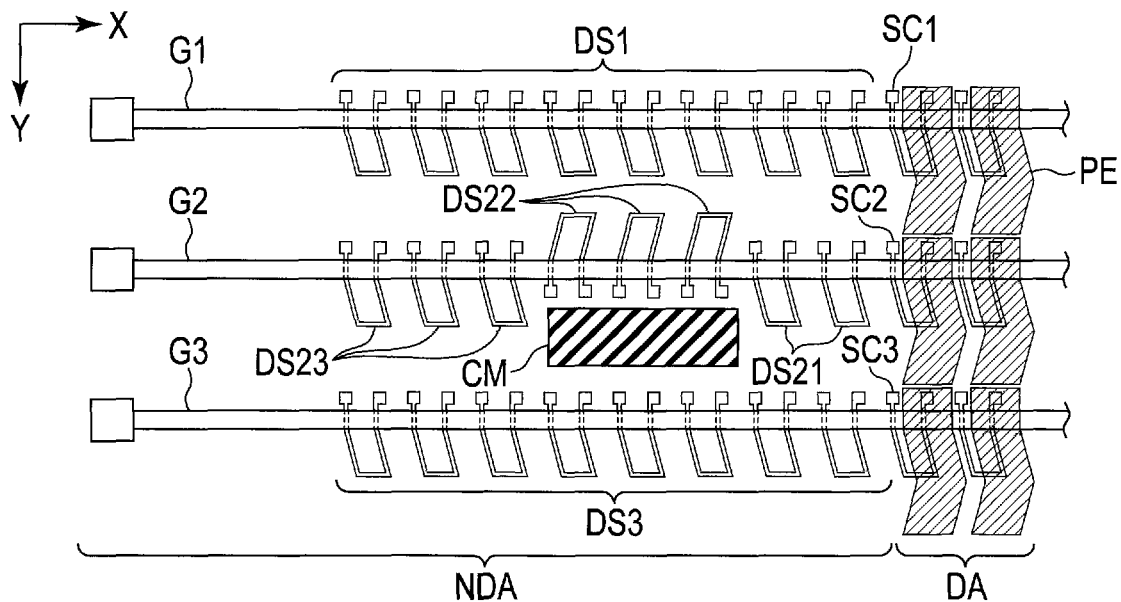
FIG. 9 is a plan view showing another layout of semiconductor layers DS.

FIG. 9 is a plan view showing another layout of the semiconductor layers DS.

The configuration example shown in FIG. 9 is different from the configuration example shown in FIG. 8A in that at least one semiconductor layer DS is arranged in a direction different from that of the other semiconductor layers DS. In the example illustrated, in the non-display area NDA, a conductive member CM is arranged between the scanning lines G2 and G3. Examples of the conductive member CM are various circuits, various metal patterns, and various electrodes.

A semiconductor layer SC1 and a semiconductor layer DS1 cross the scanning line G1. A semiconductor layer SC3 and a semiconductor layer DS3 cross the scanning line G3. The semiconductor layer SC1 and the semiconductor layer DS1, and the semiconductor layer SC3 and the semiconductor layer DS3 are all formed in the same shape, and are arranged in the same direction.

A semiconductor layer SC2 and semiconductor layers DS21 to DS23 cross the scanning line G2. The semiconductor layer SC2 and the semiconductor layers DS21 to DS23 are all formed in the same shape. The semiconductor layers DS21 and DS23 are arranged in the same direction as that of the semiconductor layer SC2. Meanwhile, the conductive member CM is arranged between the semiconductor layer DS22 and the semiconductor layer DS3, and the semiconductor layer DS22 is arranged in a direction different from that of the semiconductor layer SC2. More specifically, each of the semiconductor layers DS21 and DS23 is formed in the shape of letter U making a turn on a side closer to the scanning line G3 relative to the scanning line G2. On the other hand, the semiconductor layer DS22 is formed in the shape of letter U making a turn on a side closer to the scanning line G1 relative to the scanning line G2.

When such a configuration example is adopted, not only can the same advantages as those of the above configuration example be obtained, but lowering of the ESD resistance in the respective scanning lines can also be suppressed because the required number of semiconductor layers DS can be disposed even if the conductive member CM is arranged between the scanning lines in the non-display area NDA.

Figure 10:
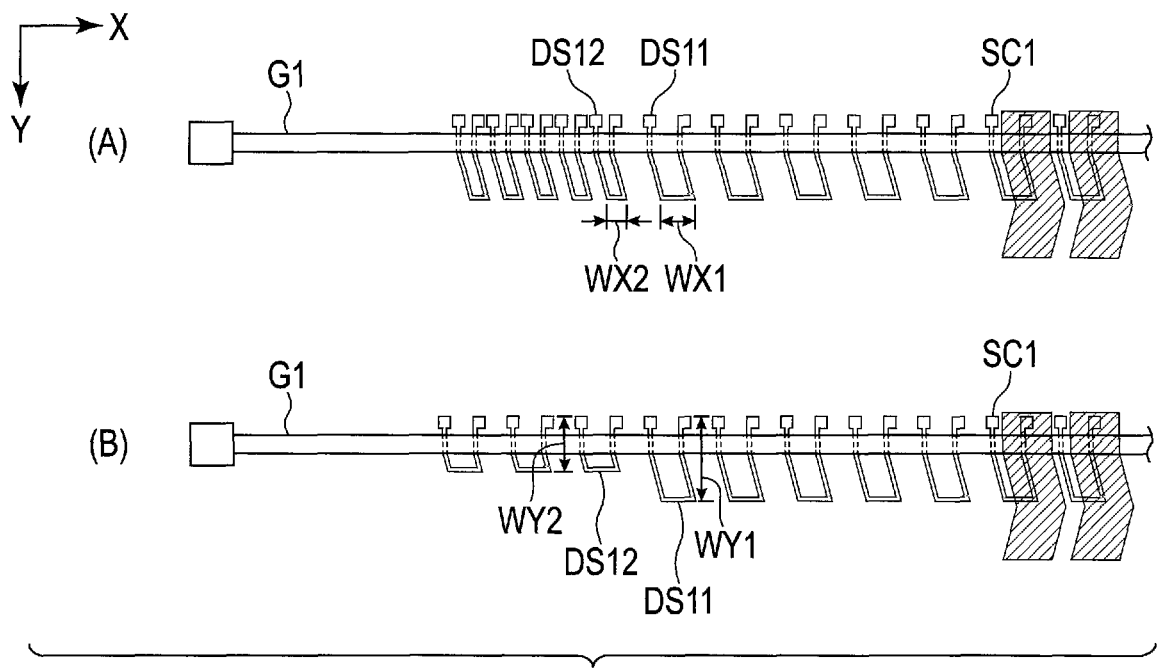
FIG. 10 is a plan view showing yet another layout of the semiconductor layers DS.

FIG. 10 is a plan view showing yet another layout of the semiconductor layers DS.

The configuration examples shown in FIGS. 10(A) and (B) are different from the configuration example shown in FIG. 8A in that at least one semiconductor layer DS is shaped differently from the other semiconductor layers DS. The semiconductor layer SC1 and semiconductor layers DS11 and DS12 cross the scanning line G1. The semiconductor layers SC1 and the semiconductor layers DS11 are all formed in the same shape. The semiconductor layer DS12 has a shape different from that of the semiconductor layer DS11.

In the configuration example shown in FIG. 10(A), the semiconductor layer DS12 is relatively small as compared to the semiconductor layer DS11. The semiconductor layer DS11 has a width WX1 along the first direction X, and the semiconductor layer DS12 has a width WX2 along the first direction X. The width WX2 is less than the width WX1.

In the configuration example shown in FIG. 10(B), the semiconductor layer DS12 is relatively small as compared to the semiconductor layer DS11. The semiconductor layer DS11 has a width WY1 along the second direction Y, and the semiconductor layer DS12 has a width WY2 along the second direction Y. The width WY2 is less than the width WY1.

Also in this configuration example, the same advantages as those of the above configuration example can be obtained.

Figure 11:
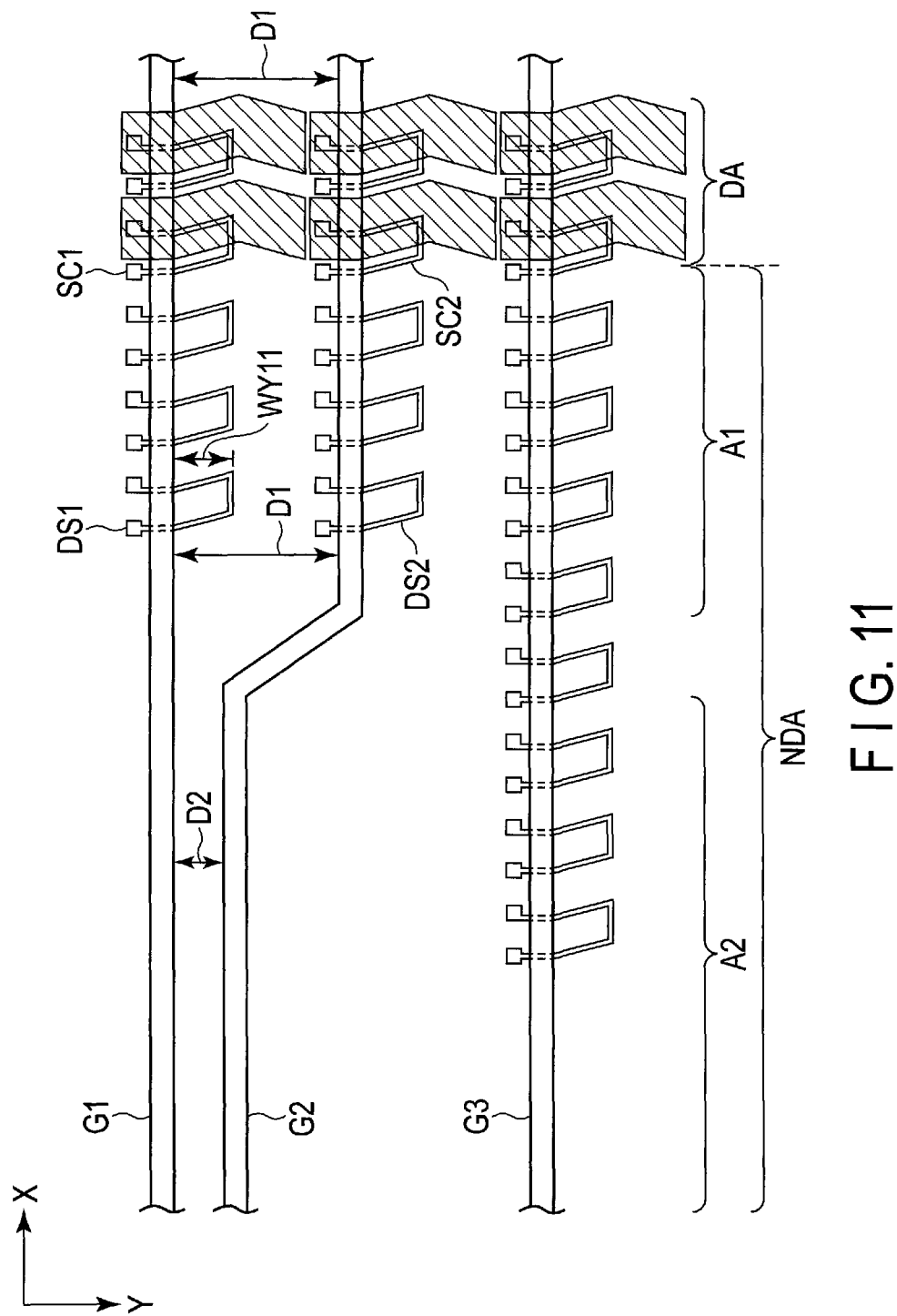
FIG. 11 is a plan view showing yet another layout of the semiconductor layers DS.

FIG. 11 is a plan view showing yet another layout of the semiconductor layers DS.

The non-display area NDA includes a first area A1 and a second area A2. The first area A1 and the second area A2 are adjacent to each other. The first area A1 and the display area DA are adjacent to each other. The second area A2 is more distant from the display area DA than the first area A1.

Here, the scanning line G1 corresponds to the first scanning line, and the scanning line G2 corresponds to the second scanning line. The scanning lines G1 and G2 are arranged at an interval D1 in the display area DA and the first area A1, and are arranged at an interval D2, which is less than the interval D1, in the second area A2. In the example illustrated, the scanning line G1 extends linearly along the first direction X over the display area DA and the non-display area NDA. The scanning line G2 extends linearly along the first direction X in the display area DA and the first area A1, is bent toward a side close to the scanning line G1 between the first area A1 and the second area A2, and extends linearly along the first direction X in the second area A2.

The scanning line G1 crosses the semiconductor layer SC1 in the display area DA, and crosses the semiconductor layer DS1 in the first area A1, but no semiconductor layer is disposed in the second area A2. The above applies to the scanning line G2. That is, the scanning line G2 crosses the semiconductor layer SC2 in the display area DA, and crosses a semiconductor layer DS2 in the first area A1, but no semiconductor layer is disposed in the second area A2.

When length WY11 of the semiconductor layer DS1 protruding in the second direction Y from the scanning line G1 to the scanning line G2 is greater than the interval D2, if the semiconductor layer DS1 crossing the scanning line G1 is arranged in the second area A2, the arranged semiconductor layer DS1 crosses the scanning lines G1 and G2. If a single semiconductor layer forms capacitive coupling with multiple scanning lines, a signal supplied to each scanning line may be adversely affected. Accordingly, in an area where an interval between the adjacent scanning lines G1 and G2 is small as in the configuration example illustrated in FIG. 11, having the adverse effect as described above can be prevented by not arranging a semiconductor layer crossing these scanning lines.

FIG. 12 is a plan view showing yet another layout of the semiconductor layers DS.

The configuration example shown in FIG. 12 is different from the configuration example shown in FIG. 11 in that a semiconductor layer DS13 crossing the scanning line G1, and the semiconductor layer DS23 crossing the scanning line G2 are provided in the second area A2. The semiconductor layer DS13 is smaller than the semiconductor layer DS1. Also, the semiconductor layer DS23 is smaller than the semiconductor layer DS2. Here, the semiconductor layer DS13 corresponds to a fifth semiconductor layer, and the semiconductor layer DS23 corresponds to a sixth semiconductor layer. The width of each of the semiconductor layers DS13 and DS23 along the second direction Y is smaller than that of the other semiconductors likewise the semiconductor layer DS12 shown in FIG. 10(B).

Also in this configuration example, the same advantages as those of the above configuration example can be obtained.

Next, another configuration example of the semiconductor layer SC which can be applied to the present embodiment will be described.

Figure 13:
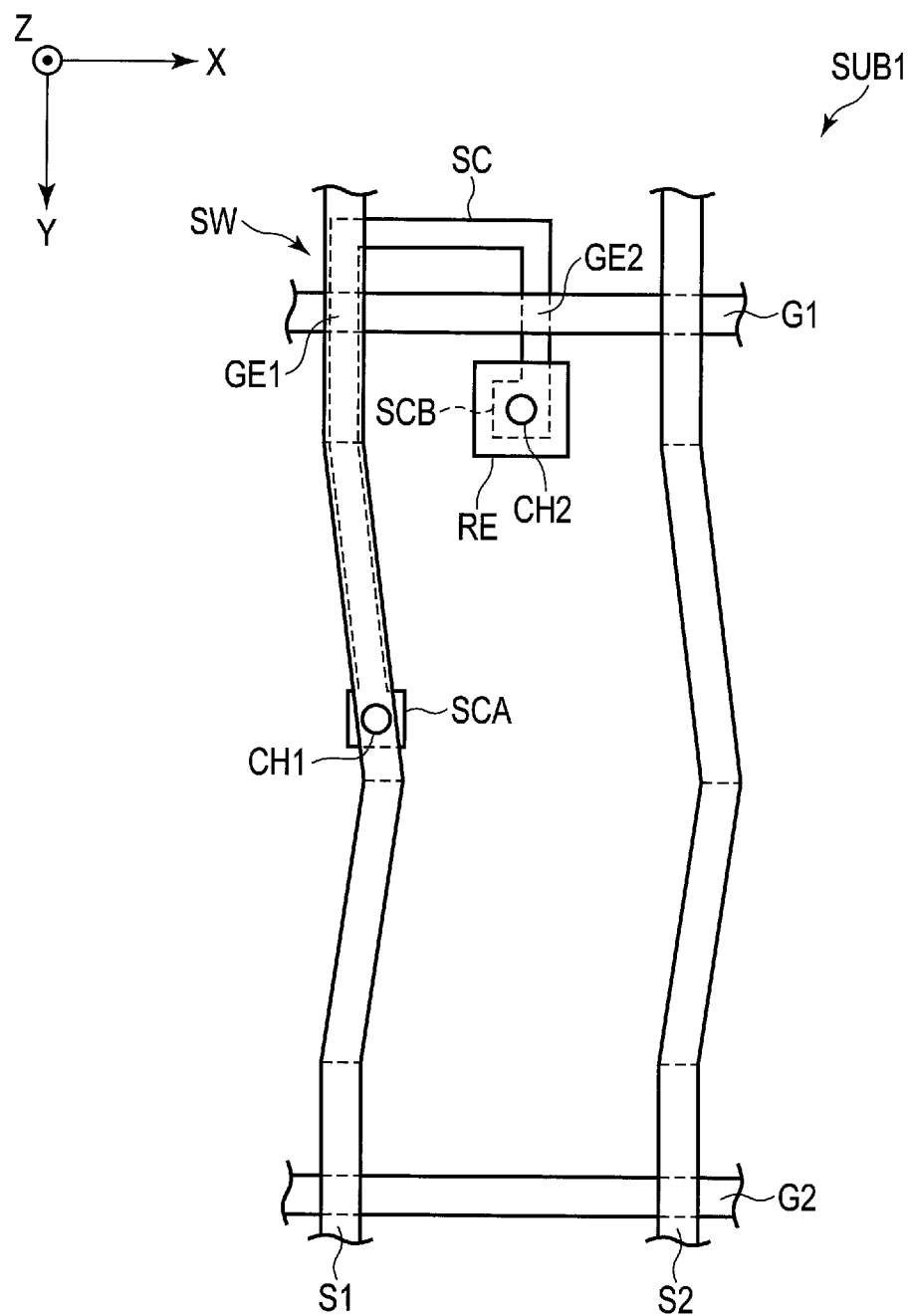
FIG. 13 is a plan view showing another configuration example of the pixel PX when the first substrate SUB1 shown in FIG. 1 is viewed from the second substrate SUB2.

FIG. 13 is a plan view showing another configuration example of the pixel PX when the first substrate SUB1 shown in FIG. 1 is viewed from the second substrate SUB2.

The configuration example shown in FIG. 13 is different from the configuration example shown in FIG. 4 in that the semiconductor layer SC is formed substantially in the shape of letter J. The end portion SCA and the other end portion SCB of the semiconductor layer SC are located between the scanning lines G1 and G2. The end portion SCA overlaps the signal line S1, and is electrically connected to the signal line S1 through the contact hole CH1. The relay electrode RE is formed in an island shape, is disposed between the scanning lines G1 and G2 and between the signal lines S1 and S2, and is electrically connected to the other end portion SCB through the contact hole CH2.

The semiconductor layer SC having such a shape can be applied as the semiconductor layer DS of the non-display area NDA as in the above configuration example.

Next, another configuration example of the pixel electrode PE which can be applied to the present embodiment will be described.

FIG. 14 is a plan view showing another configuration example of the pixel electrode PE arranged in the pixel PX.

The configuration example shown in FIG. 14 is different from the configuration example shown in FIG. 5 in that the common electrode CE is overlaid on the pixel electrode PE. The pixel electrode PE is formed in a plate shape not including a slit, and is disposed between the signal lines S1 and S2. The common electrode CE is overlaid on the signal lines S1 and S2, and the pixel electrode PE. The common electrode CE includes a slit CSL directly above the pixel electrode PE. In the example illustrated, the common electrode CE includes two slits CSL which are bent likewise the signal line S1 at a position opposed to one pixel electrode PE. The two slits CSL are arranged at an interval in the first direction X, and have a substantially uniform width along the first direction X. Note that the shape of the pixel electrode PE is not limited to that of the example illustrated, and can be changed as appropriate according to the shape, etc., of the pixel PX. Also, the shape, the number, and the like, of the slits CSL are not limited to those of the example illustrated.

In such a configuration example, the semiconductor layer SC of the switching element SW may be formed to be substantially U-shaped, as shown in FIG. 4, or substantially J-shaped, as shown in FIG. 13. Also, with respect to the shape of the semiconductor layer arranged in the non-display area NDA, any of the above configuration examples may be applied.

As described above, according to the present embodiment, it is possible to provide a display device with suppressed reduction in the manufacturing yield.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first substrate having a first long edge and a first short edge;
a first scanning line and a second scanning line which extend over a display area and a non-display area;
first semiconductors overlapping the first scanning line in the non-display area, the first semiconductors being a in number;
second semiconductors overlapping the second scanning line in the non-display area, the second semiconductors being b in number;
third semiconductors overlapping the first scanning line in the display area, the third semiconductors being c in number;
fourth semiconductors overlapping the second scanning line in the display area, the fourth semiconductors being d in number; and
a gate drive circuit located along the first long edge in the non-display area, wherein
a is different from b,
c is different from d,
the gate drive circuit includes a first shift register and a second shift register,
the first shift register is configured to control the first scanning line,
the second shift register is configured to control the second scanning line, and
the first shift register and the second shift register are arranged along a first long edge, and are located at a same position along the first short edge.

2. The display device of claim 1, wherein
the display area has a first long side, a first short side, and a round portion,
the first long side is along the first long edge,
the first short side is along the first short edge,
the round portion connects the first long side and the first short side, and
the first long side, the first short side, and the round portion are a part of a border between the display area and the non-display area.

3. The display device of claim 2, wherein
the first scanning line has a first length in the non-display area,
the second scanning line has a second length different from the first length in the non-display area,
the first scanning line has a third length in the display area,
the second scanning line has a fourth length different from the third length in the display area,
the second scanning line is located between the first scanning line and the first short side,
b is greater than a,
c is greater than d,
the second length is greater than the first length, and
the third length is greater than the fourth length.

4. The display device of claim 3, wherein
the first scanning line intersects the first long side, and
the second scanning line intersects the round portion.

5. The display device of claim 3, wherein the first scanning line and the second scanning line intersect the round portion.

6. The display device of claim 3, further comprises a plurality of pixel electrodes in the display area, wherein
the third semiconductors and the fourth semiconductors are electrically connected to the pixel electrodes, respectively, and
the first semiconductors and the second semiconductors are not connected to the pixel electrodes.

7. The display device of claim 3, wherein a distance between the first shift register and the first long edge along the first short edge is substantially same as a distance between the second shift register and the first long edge along the first short edge.

8. The display device of claim 3, wherein a, b, c, and d are integers greater than or equal to 2.

9. A display device comprising:
a first substrate having a first short edge extending in a first direction and a first long edge extending in a second direction;
a first scanning line and a second scanning line which extend over a display area and a non-display area;
first semiconductors overlapping the first scanning line in the non-display area, the first semiconductors being a in number;
second semiconductors overlapping the second scanning line in the non-display area, the second semiconductors being b in number;
third semiconductors overlapping the first scanning line in the display area, the third semiconductors being c in number;
fourth semiconductors overlapping the second scanning line in the display area, the fourth semiconductors being d in number; and
a gate drive circuit located in the second direction in the non-display area,
wherein
a is different from b,
c is different from d,
the gate drive circuit includes a first shift register and a second shift register,
the first shift register is configured to control the first scanning line,
the second shift register is configured to control the second scanning line, and
the first shift register and the second shift register are arranged in a straight line extending in the second direction.

10. The display device of claim 9, wherein
the display area has a first long side, a first short side and a corner portion,
the first long side is along the first long edge,
the first short side is along the first short edge,
the corner portion connects the first long side and the first short side, and the first long side, the first short side, and the corner portion are a part of a border between the display area and the non-display area.

11. The display device of claim 10, wherein
the first scanning line has a first length in the non-display area,
the second scanning line has a second length different from the first length in the non-display area,
the first scanning line has a third length in the display area,
the second scanning line has a fourth length different from the third length in the display area,
the second scanning line is located between the first scanning line and the first short side,
b is greater than a,
c is greater than d,
the second length is greater than the first length, and
the third length is greater than the fourth length.

12. The display device of claim 11, wherein the first scanning line and the second scanning line intersect the corner portion.

13. The display device of claim 11, further comprises a plurality of pixel electrodes in the display area, wherein
the third semiconductors and the fourth semiconductors are electrically connected to the pixel electrodes, respectively, and
the first semiconductors and the second semiconductors are not connected to the pixel electrodes.

* * * * *